United States Patent
Kim et al.

(10) Patent No.: US 9,960,282 B2
(45) Date of Patent: May 1, 2018

(54) CRYSTALLIZATION METHOD FOR OXIDE SEMICONDUCTOR LAYER, SEMICONDUCTOR DEVICE MANUFACTURED USING THE SAME, AND METHOD FOR MANUFACTURING THE SEMICONDUCTOR DEVICE

(71) Applicant: LG Display Co., Ltd., Seoul (KR)

(72) Inventors: Min-Cheol Kim, Goyang-si (KR); Youn-Gyoung Chang, Goyang-si (KR); Kwon-Shik Park, Seoul (KR); So-Hyung Lee, Goyang-si (KR); Ho-Young Jung, Paju-si (KR); Ha-Jin Yoo, Paju-si (KR); Jeong-Suk Yang, Asan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/643,030

(22) Filed: Jul. 6, 2017

(65) Prior Publication Data
US 2017/0309749 A1 Oct. 26, 2017

Related U.S. Application Data

(62) Division of application No. 14/937,598, filed on Nov. 10, 2015, now Pat. No. 9,735,281.

(30) Foreign Application Priority Data

Dec. 9, 2014 (KR) .................. 10-2014-0175686

(51) Int. Cl.
*H01L 21/00* (2006.01)
*H01L 29/786* (2006.01)
(Continued)

(52) U.S. Cl.
CPC .... *H01L 29/7869* (2013.01); *H01L 21/02554* (2013.01); *H01L 21/02565* (2013.01);
(Continued)

(58) Field of Classification Search
CPC ............ H01L 29/7869; H01L 27/1225; H01L 29/66969; H01L 29/24; H01L 27/124
(Continued)

(56) References Cited

U.S. PATENT DOCUMENTS 8,536,571 B2  9/2013  Yamazaki
2008/0258141 A1*  10/2008  Park .................. H01L 29/78618
                                                257/43
(Continued)

FOREIGN PATENT DOCUMENTS

CN  101814529 A  8/2010
CN  102668098 A  9/2012
(Continued)

*Primary Examiner* — Andy Huynh
(74) *Attorney, Agent, or Firm* — Birch, Stewart, Kolasch & Birch, LLP (57) ABSTRACT

A method for manufacturing a semiconductor device is discussed. The method includes forming a gate electrode on a substrate, forming a gate insulating film over the substrate, depositing an In—Ga—Zn oxide over the gate insulating film while heating the substrate to a temperature of 200 to 300° C., an atomic percent ratio of Zn in the In—Ga—Zn oxide as-deposited being higher than that of In or Ga, heat-treating the deposited In—Ga—Zn oxide at a temperature of 200 to 350° C., thereby forming an active layer crystallized throughout an entire thickness of the active layer, and forming a source electrode and a drain electrode.

4 Claims, 12 Drawing Sheets

(51) Int. Cl.
 *H01L 21/02* (2006.01)
 *H01L 21/477* (2006.01)
 *H01L 29/10* (2006.01)

(52) U.S. Cl.
 CPC .. *H01L 21/02631* (2013.01); *H01L 21/02667* (2013.01); *H01L 21/477* (2013.01); *H01L 29/1033* (2013.01)

(58) Field of Classification Search
 USPC .............................................. 257/43; 438/85
 See application file for complete search history.

(56) References Cited

U.S. PATENT DOCUMENTS

| | | |
|---|---|---|
| 2011/0084264 A1 | 4/2011 | Yamazaki et al. |
| 2011/0151618 A1 | 6/2011 | Yamazaki et al. |
| 2012/0286262 A1 | 11/2012 | Koyama |

FOREIGN PATENT DOCUMENTS

| | | |
|---|---|---|
| CN | 103026416 A | 4/2013 |
| CN | 104185898 A | 12/2014 |
| JP | 2011-100979 A | 5/2011 |
| JP | 2011-146697 A | 7/2011 |

\* cited by examiner

CRYSTALLIZATION METHOD FOR OXIDE SEMICONDUCTOR LAYER, SEMICONDUCTOR DEVICE MANUFACTURED USING THE SAME, AND METHOD FOR MANUFACTURING THE SEMICONDUCTOR DEVICE

CROSS-REFERENCE TO RELATED APPLICATIONS

This application is a Divisional of U.S. patent application Ser. No. 14/937,598 filed Nov. 10, 2015 which claims the priority benefit under 35 U.S.C. § 119(a) of Korean Patent Application No. 10-2014-0175686, filed on Dec. 9, 2014, each of which are hereby incorporated by reference as if fully set forth herein.

BACKGROUND OF THE INVENTION

Field of the Invention

The present invention relates to a method for manufacturing an oxide semiconductor, and more particularly to a crystallization method for an oxide semiconductor layer, which achieves an enhancement in crystallization characteristics, thereby achieving an enhancement in reliability of the resultant device, a semiconductor device manufactured using the same, and a method for manufacturing the semiconductor device.

Discussion of the Related Art

With the advent of the information age, the demand for various display devices has increased. To meet such a demand, efforts have recently been made to research display devices such as liquid crystal display (LCD) devices, plasma display panels (PDPs), electroluminescent display (ELD) devices, vacuum fluorescent display (VFD) devices, and the like. Some types of such display devices are being practically applied to various appliances for display purposes.

Such a display device includes a thin film transistor (TFT) array substrate including thin film transistors (TFTs) formed at respective pixel areas as switching elements. The TFTs are formed at respective pixel areas defined through intersection of gate lines and data lines. Each TFT is formed with an active layer to form a channel area, a gate insulating film, a gate electrode, a source electrode and a drain electrode.

In conventional cases, the active layer is made of silicon. In particular, crystalline silicon has been required to obtain sufficient carrier mobility and stable electrostatic characteristics. For such crystallization, however, high temperature of 500° C. or more is required. In order to withstand such a high temperature process, there is a limitation in selection of a support substrate formed with an active layer. For this reason, use of the above-mentioned material in a flexible substrate may be impractical.

Recently, transparent oxide semiconductors have been highlighted and, as such, attempts to apply the material to an active layer have been made.

Japanese Patent Publication No. JP2011-100979 discloses crystallization of a surface of an active layer in a semiconductor device in order to achieve contact characteristics of the active layer with respect to source/drain electrodes disposed thereon while preventing permeation of moisture into the surface of the active layer when an oxide semiconductor is applied to the active layer of the semiconductor device. Japanese Patent Publication No. JP2011-146697 discloses crystallization of an oxide semiconductor layer through heat treatment carried out several times at 650° C. or more after deposition of the oxide semiconductor layer. The former discloses crystallization of only the surface of the oxide semiconductor layer, and the latter discloses formation of a double layer structure including a semiconductor layer as a first layer and an oxide semiconductor layer as a second layer, and utilization of the first layer, namely, the semiconductor layer, as a seed for formation of crystals.

In the above-mentioned oxide semiconductor crystallization methods, however, high temperature of 500° C. or more is required as a heat treatment temperature in application of the above-mentioned silicon crystallization. For this reason, it may be difficult to stably maintain the support substrate, which exhibits low heat resistance, during a crystallization process. As a result, it may be difficult to use the above-mentioned methods in manufacture of a large-area display device.

SUMMARY OF THE INVENTION

Accordingly, the present invention is directed to a crystallization method for an oxide semiconductor layer, a semiconductor device manufactured using the same, and a method for manufacturing the semiconductor device that substantially obviate one or more problems due to limitations and disadvantages of the related art.

An object of the invention is to provide a crystallization method for an oxide semiconductor layer, which achieves an enhancement in crystallization characteristics, thereby achieving an enhancement in reliability of the resultant device, a semiconductor device manufactured using the same, and a method for manufacturing the semiconductor device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for crystallizing an oxide semiconductor layer includes depositing an In—Ga—Zn oxide over a substrate while heating the substrate to a temperature of 200 to 300° C., and heat-treating the deposited In—Ga—Zn oxide, thereby forming an oxide semiconductor layer crystallized throughout an entire thickness of the oxide semiconductor layer. Heat is applied, starting from the deposition process and, as such, crystallization of the oxide semiconductor layer may be achieved at a low temperature.

In addition, the target used in the deposition can have an In—Ga—Zn composition of 1:1:1.10~1.25, to compensate for loss of Zn during deposition and heat treatment process and, as such, the composition of the semiconductor layer obtained after crystallization may correspond to $InGaZnO_4$. That is, in the crystallized final semiconductor layer, composition ratios of In, Ga, and Zn may be almost equal. The composition ratio of Zn to In may be almost 1:0.9~1.1.

In another aspect of the invention, a method for manufacturing a semiconductor device, to which the above-described crystallization method is applied, includes forming a gate electrode on a substrate, and forming a gate insulating film over the substrate, to cover the gate electrode, before crystallization, and forming a source electrode and a drain electrode, which contact both sides of the patterned active layer, respectively, after crystallization.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE EMBODIMENTS

Reference will now be made in detail to the preferred embodiments of the invention associated with a crystallization method for an oxide semiconductor layer, a semiconductor device manufactured using the same, and a method for manufacturing the semiconductor device, examples of which are illustrated in the accompanying drawings.

Figure 1:
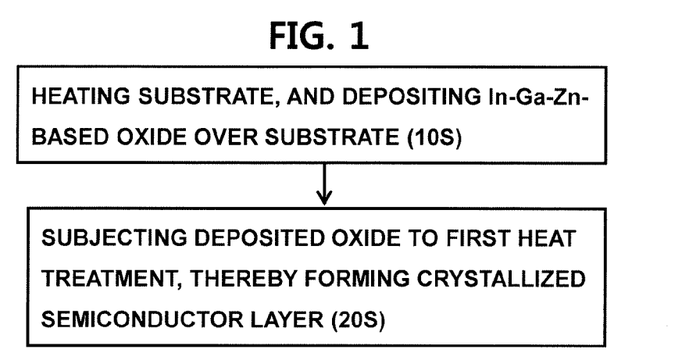
FIG. 1 is a flowchart illustrating a crystallization method for an oxide semiconductor layer according to an embodiment of the invention.
Figure 2A:
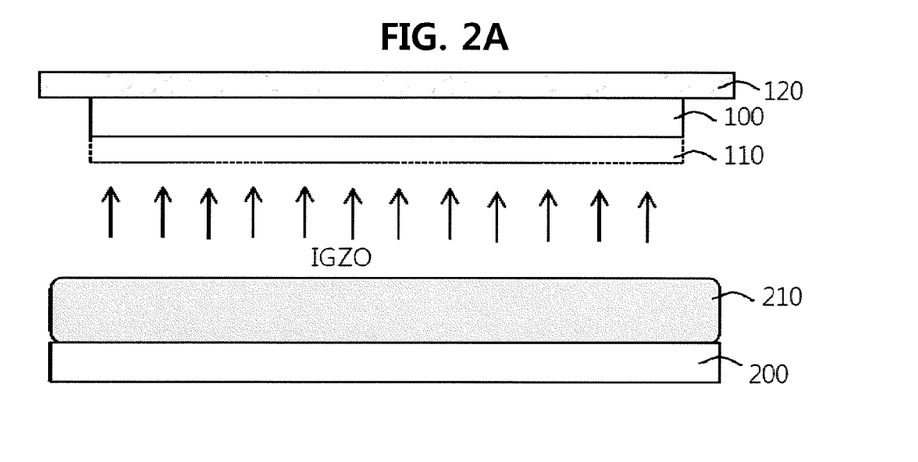
FIGS. 2A and 2B are sectional views illustrating processes in the oxide semiconductor layer crystallization method according to an embodiment of the invention.
Figure 2B:
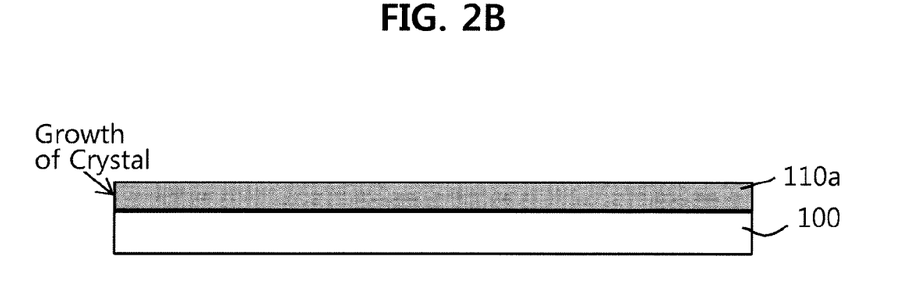

FIG. 1 is a flowchart illustrating a crystallization method for an oxide semiconductor layer according to an embodiment of the invention. FIGS. 2A and 2B are sectional views illustrating processes in the oxide semiconductor layer crystallization method according to an embodiment of the invention.

The oxide semiconductor layer crystallization method according to the embodiment of the invention can be carried out in accordance with the following sequence.

First, as illustrated in FIGS. 1 and 2A, a substrate 100 is mounted on a heater 120, and is then heated to a temperature of 200 to 300° C., and an In—Ga—Zn oxide 110 is deposited over the substrate 100 (10S).

In this case, deposition of the In—Ga—Zn oxide 110 is achieved, using a DC sputtering method. For example, the substrate 100 is mounted on the heater 120 within a chamber (not shown). Thereafter, a plate 200 covered with a target 210 having an In—Ga—Zn atomic % ratio of 1:1:1.10~1.25 is positioned in parallel with the substrate 100 while being spaced apart from the substrate 100. In this state, a DC condition is established between the substrate 100 and the plate 200 by applying a high negative voltage to the plate 200 and grounding the substrate 100 in an argon (Ar) atmosphere. As a result, plasma is generated between the plate 200 and the substrate 100. Electrons accelerated by the generated plasma cause argon cations ($Ar^+$) to be produced. The generated argon cations are accelerated and strike atoms of the target 210. Due to impact caused by such striking, the atoms are discharged from the target 210, and are then deposited over the substrate 100.

In this case, the target 210 may be an oxide containing oxygen. In the DC sputtering process, oxygen may be further supplied to the chamber.

When sputtering is carried out using a target containing In, Ga, and Zn in the same atomic % ratio, not all ingredients of the target reach the substrate during sputtering, and loss of Zn occurs. The relative content of Zn in the target 210 is adjusted to be higher than the contents of In and Ga contained in the target so as to compensate for such loss of Zn occurring during the sputtering process.

Meanwhile, the process of depositing the In—Ga—Zn oxide is carried out for 2 to 5 minutes. During this deposition process, heat is applied to the substrate 100 through the heater 120. The deposition time for the oxide 110 may vary in accordance with a desired oxide thickness and a sputtering rate. The deposition time may be determined to obtain an oxide thickness of about 30 to 70 nm.

In this regard, a low working pressure within a chamber of 1.0 to 10 mTorr is maintained during the process of depositing the oxide 110.

Thereafter, as illustrated in FIG. 2B, the deposited In—Ga—Zn oxide is subjected to first heat treatment, to form a crystallized oxide semiconductor layer 110a throughout the entire thickness of the deposited In—Ga—Zn oxide.

The temperature of the first heat treatment is 200 to 350° C. similar to the heating temperature of the substrate 100 in the process of depositing the oxide 110. The temperature of the first heat treatment need not be equal to the heating temperature of the substrate 100. The first heat treatment may be carried out by loading the deposited oxide 110 in an oven after unloading the deposited oxide 110 from the sputtering chamber or using laser equipment capable of achieving rapid heat treatment.

The first heat treatment is carried out for 10 minutes to 1 hour. The oxide 110 has crystallinity in a thickness direction thereof in accordance with the first heat treatment as well as heating of the substrate 100 carried out during deposition of the oxide 110. As a result, the oxide 110 is formed into a crystallized semiconductor layer 110a.

Even when both the heating of the substrate 100 and the first heat treatment are carried out at a temperature of 300° C. or less, uniform crystallization in a thickness direction of the semiconductor layer 110a may be achieved.

Meanwhile, a further heat treatment process may be carried out during or after formation of an insulating layer or a metal film over the semiconductor layer 110a.

Of course, in the embodied invention, it is the heating of the substrate 100 during oxide deposition and the first heat treatment process that greatly contribute to crystallization of the semiconductor layer 110a and determination of the direction of crystals in a thickness direction of the semiconductor layer 110a.

Figure 3A:
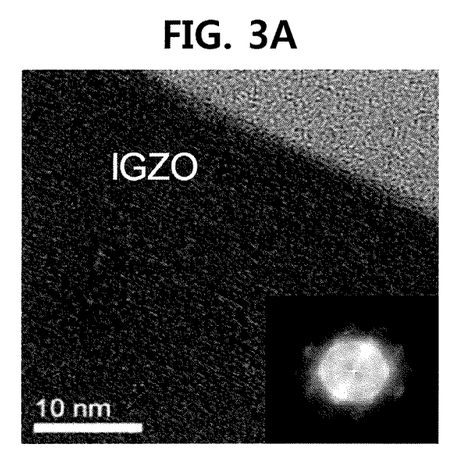
FIGS. 3A to 3C are transmission electron microscopy (TEM) photographs of oxide semiconductor layers formed at different heat treatment temperatures when the oxide semiconductor layer crystallization method of the invention is used.
Figure 3B:
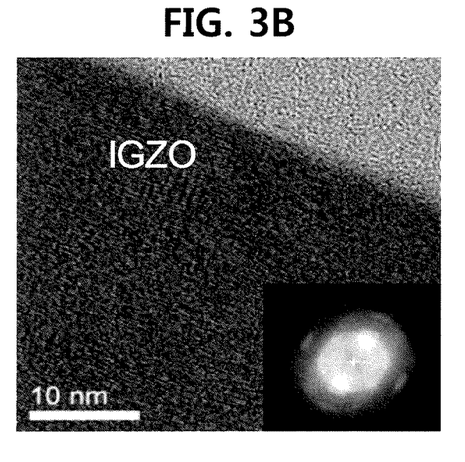
Figure 3C:
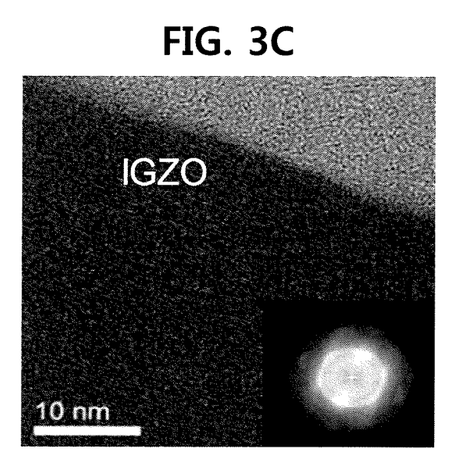

FIGS. 3A to 3C are transmission electron microscopy (TEM) photographs of oxide semiconductor layers formed at different heat treatment temperatures when the oxide semiconductor layer crystallization method of the invention is used.

States of crystals formed at different heat treatment temperatures when the oxide semiconductor layer crystallization method of the invention is used will be reviewed through TEM.

FIG. 3A is a TEM photograph obtained when the first heat treatment is carried out at 300° C. FIG. 3B is a TEM photograph obtained when the first heat treatment is carried out at 250° C. FIG. 3C is a TEM photograph obtained when the first heat treatment is carried out at 200° C. In all cases, the same heat treatment time of 1 hour is used. Referring to the TEM photographs, it can be seen that, in each case, the crystallized film is dense, and crystals thereof are oriented in a thickness direction. When an enlarged diffraction pattern in each case is observed, it can be seen that bright atoms are arranged at respective apexes of a hexagonal structure around a center of the hexagonal structure. The observed bright atoms are atoms of the ingredient having a greater atomic weight among the ingredients of the oxide, namely, indium (In) atoms. Through the above experiment, it can be seen that regular arrangement of In is obtained through the above-described oxide semiconductor layer crystallization method.

Hereinafter, a structure of an oxide semiconductor layer formed by a method that is compared to that of the embodied invention for an oxide semiconductor layer crystallization will be described.

Figure 4A:
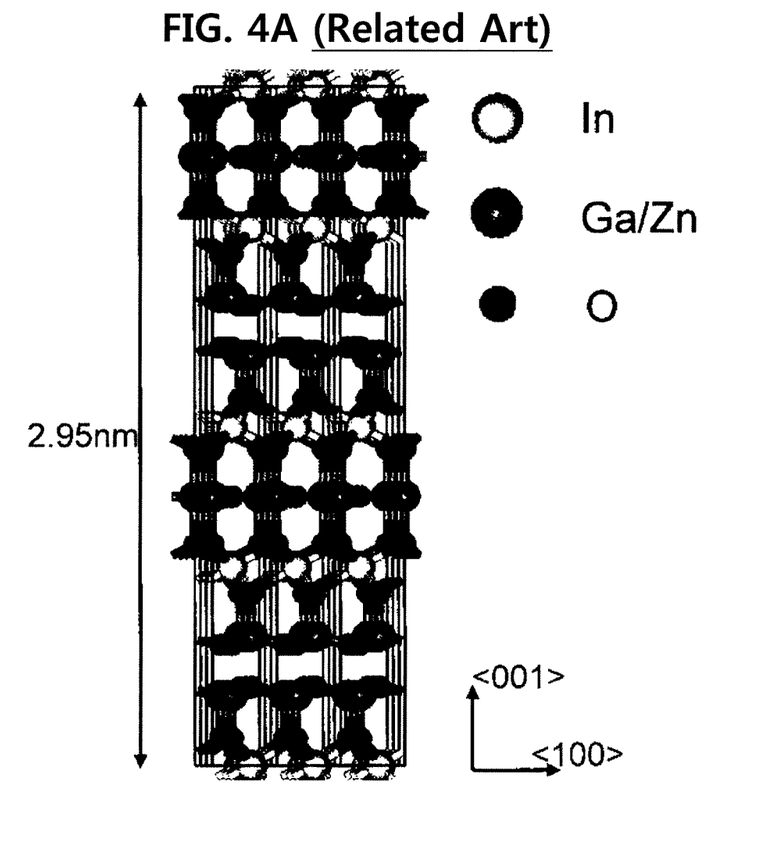
FIGS. 4A and 4B illustrate a lattice structure of $In_2Ga_2ZnO_7$ and a TEM photograph of an oxide semiconductor layer thereof under the condition that only the surface of the oxide semiconductor layer has been crystallized according to a related art.
Figure 4B:
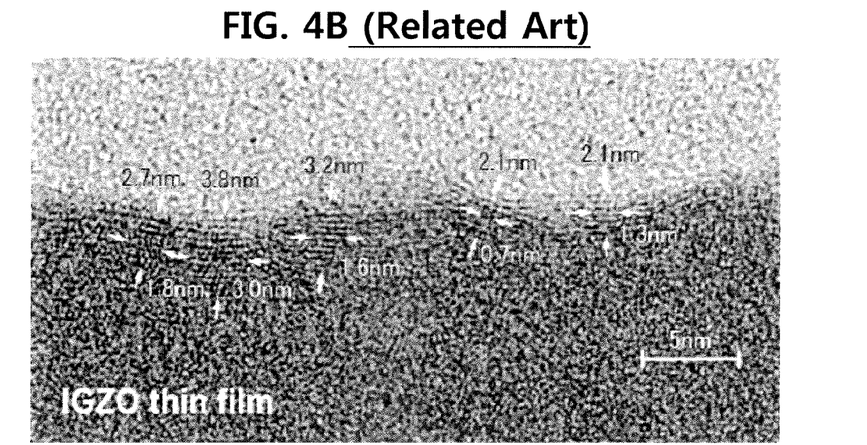

FIGS. 4A and 4B illustrate a lattice structure of $In_2Ga_2ZnO_7$ and a TEM photograph of an oxide semiconductor layer thereof under the condition that only the surface of the oxide semiconductor layer has been crystallized according to a related art.

For example, the oxide semiconductor layer formed under the condition that the atomic % ratio of In, Ga, and Zn in an IGZO oxide target is 1:1:0.5 is $In_2Ga_2ZnO_7$. Crystallization of an oxide semiconductor layer disclosed in Japanese Patent Publication No. JP2011-100979 requires heat treatment to be carried out several times after deposition of an oxide semiconductor. Furthermore, the required heat treatment temperature is 500° C. or more.

Meanwhile, referring to the lattice structure of $In_2Ga_2ZnO_7$ through FIG. 4A, it can be seen that a single or double layer of GaO or ZnO is repetitively formed between InO layers. Ga and Zn in the lattice structure are similarly exhibited in an optical experiment such as diffraction because the atomic weights of Ga and Zn are similar. In the illustrated lattice structure, accordingly, Ga and Zn are shown as being the same.

In this case, it may be seen that, when the atomic % ratio of In, Ga, and Zn in the above-described target is 1:1:0.5, a crystalline structure is formed at a very small thickness portion of the oxide semiconductor layer extending from the surface of the oxide semiconductor layer in a thickness direction, that is, a thickness portion of about 2.1 to 3.8 nm, even under high temperature crystallization conditions.

That is, crystals formed in the above-mentioned method do not have regularity in that GaO or ZnO are arranged in the form of a single or double layer between InO layers and, as such, it may be difficult to obtain a crystalline structure formed throughout the thickness of the oxide semiconductor layer, as compared to the oxide semiconductor layer crystallization method of the present invention. Furthermore, high temperature of 500° C. or more is required for crystallization and, as such, stress of the substrate may be increased for formation of a crystallized semiconductor layer of $In_2Ga_2ZnO_7$.

Figure 5:
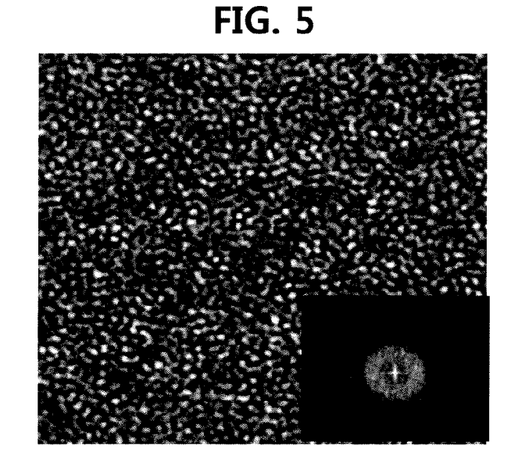
FIG. 5 is a TEM photograph of an oxide semiconductor layer obtained after heat treatment of an oxide semiconductor deposited under the condition that the atomic % ratio of In, Ga, and Zn in the target is 1:1:1.

FIG. 5 is a TEM photograph of an oxide semiconductor layer obtained after heat treatment of an oxide semiconductor target deposited under the condition that the atomic % ratio of In, Ga, and Zn in the target is 1:1:1.

Meanwhile, a simple low-temperature crystallization method may be applied for crystallization of known oxide semiconductors. However, the inventors of the present invention found that, when a target having an atomic % ratio of In, Ga, and Zn corresponding to 1:1:1 is used for formation of an active layer of $InGaZnO_4$, it is impossible to form crystals, using the above-mentioned low-temperature process.

This will be described in more detail. When sputtering is carried out in sputtering equipment under the condition that the In—Ga—Zn atomic % ratio of an IGZO oxide target is 1:1:1, and the deposition temperature condition in sputtering is 300° C., and heat treatment at 300° C. is carried out in an oven after completion of sputtering, arrangement of indium atoms (most bright particles observed on the TEM photograph) is randomly exhibited, as illustrated in FIG. 5. Accordingly, it can be seen that no crystallization is achieved even when double heat treatment is carried out.

In addition, even when heat treatment in the oven is carried out for 1 hour at an increased temperature of 450° C., arrangement of indium atoms is still randomly exhibited, indicating that no crystallization is achieved.

Meanwhile, referring to an electron diffraction photograph shown at a lower portion of the TEM photograph, it can be seen that the diffraction pattern is observed as being obscure, except for the center thereof. This can mean that no crystallization is exhibited even after heat treatment.

That is, the oxide semiconductor layer crystallization method of the invention is not only characterized in that the heat treatment temperature is reduced to 350° C. or less, but also characterized in that uniform crystallization characteristics throughout the thickness of the finally crystallized semiconductor layer are obtained by supplying an excess of Zn, taking into consideration loss of Zn occurring from the target having the same atomic % ratio of In, Ga, and Zn in a low-temperature process.

In related art crystallization methods for formation of an oxide semiconductor layer of $In_2Ga_2ZnO_7$ or $InGaZnO_4$, heat treatment at 500° C. or more is not randomly used, but is intentionally used to obtain a composition ratio of In:Ga:Zn in the semiconductor layer, to be formed, equal to that of the IGZO oxide target. In this regard, it may be appreciated that insufficient crystallization is obtained, using a low-temperature process. That is, in known conventional crystallization methods for an oxide semiconductor layer, relative loss of Zn occurring during sputtering in a low-temperature process or in a heat treatment process is never taken into consideration.

Hereinafter, the structure of the crystallized oxide semiconductor layer according to one or more embodiments of the invention will be described.

Figure 6A:
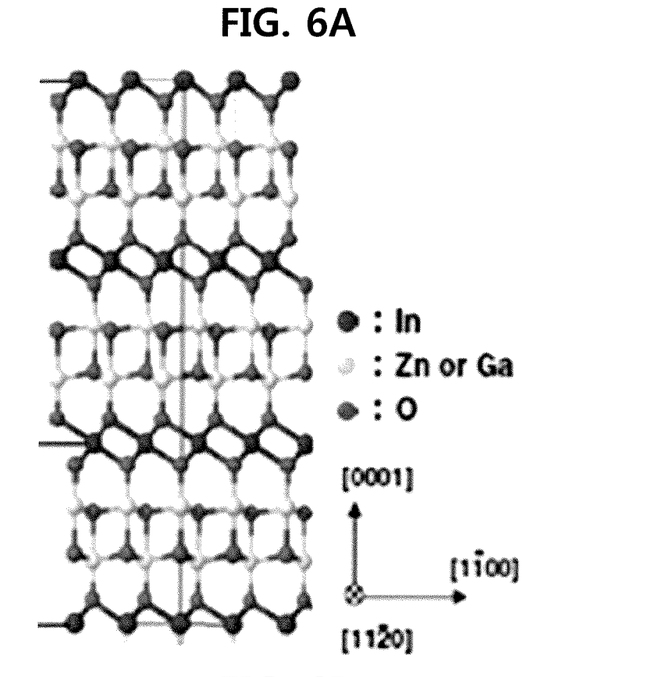
FIGS. 6A to 6C illustrate a lattice structure of IGZO ingredients contained in the oxide semiconductor layer of the invention, a TEM photograph thereof, and an enlarged photograph thereof according to an embodiment of the invention.
Figure 6B:
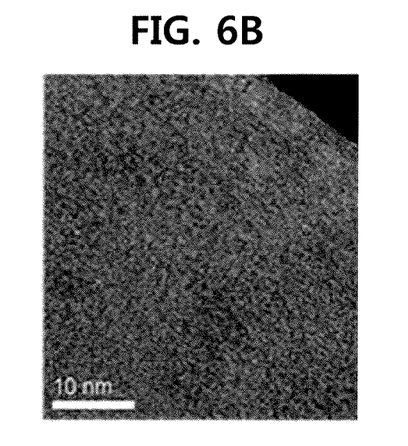
Figure 6C:
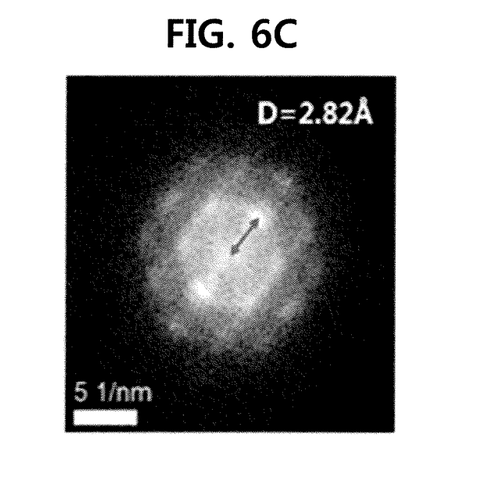

FIGS. 6A to 6C illustrate a lattice structure of IGZO ingredients contained in the oxide semiconductor layer of the invention, a TEM photograph thereof, and an enlarged photograph thereof.

FIG. 6A illustrates an IGZO lattice structure of the crystallized oxide semiconductor layer. Referring to FIG. 6A, it can be seen that a ZnO or GaO layer having a double layer structure is regularly distributed between InO layers. It may also be seen that uniform growth in a [0001] direction (c-axis direction—thickness direction of the semiconductor layer) has been generated.

Meanwhile, FIGS. 6B and 6C correspond to the TEM photograph and electron diffraction photograph described in conjunction with FIGS. 3A to 3C. Referring to the enlarged electron diffraction photograph of FIG. 6C, regular arrangement of In may be more apparently observed.

Figure 7:
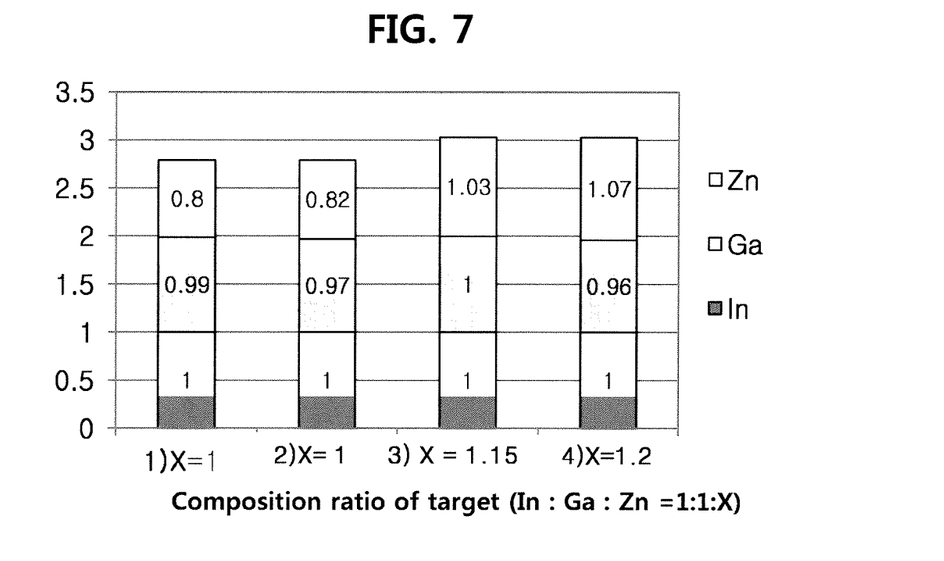
FIG. 7 is a graph depicting analyzed results of composition ratios of completely crystallized active layers in different cases having the same atomic % ratio of In and Ga, namely, 1:1, while having atomic % ratios of In and Zn corresponding to 1:1, 1:1, 1:1.15, and 1:1.2, respectively, when the oxide semiconductor layer crystallization method of the invention is used.

FIG. 7 is a graph depicting analyzed results of composition ratios of completely crystallized active layers in different cases having the same atomic % ratio of In and Ga, namely, 1:1, while having atomic % ratios of In and Zn corresponding to 1:1, 1:1, 1:1.15, and 1:2, respectively, when the oxide semiconductor layer crystallization method of the invention is used.

FIG. 7 illustrates four experimental examples. In detail, FIG. 7 illustrates composition ratios obtained after final heat treatment in four experimental examples deposited using targets having the same atomic % ratio of In and Ga, namely, the In—Ga atomic % ratio of 1:1, while having different atomic % ratios of In and Zn.

When it is assumed that the atomic % ratios of In and Zn in the four experimental examples are 1:X, the atomic % ratios of In and Zn are 1:1, 1:1, 1:1.15, and 1:1.2, when viewed from the left side.

The reason why composition ratios obtained after final heat treatment in the left two experimental examples having the In—Zn atomic % ratio of 1:1 are different appears to be caused by a small experimental variation.

In FIG. 7, composition ratios of In, Ga, and Zn obtained after final heat treatment are shown in this order when viewed from the bottom side.

That is, referring to the graph, when the atomic % ratio of In and Zn is 1:1, it can be seen that, among In, Ga, and Zn of the same content in the target oxide supplied during deposition, Zn is lost in that the composition ratio of Zn is reduced to 0.8, as compared to the remaining ingredients.

On the other hand, when the composition ratio of Zn to In is increased to 1.15 or 1.2, it can be seen that Zn in the final oxide semiconductor layer is observed as having the almost same content as In.

Hereinafter, a method for manufacturing a semiconductor device according to the invention will be described with reference to the accompanying drawings.

First Embodiment

Figure 8:
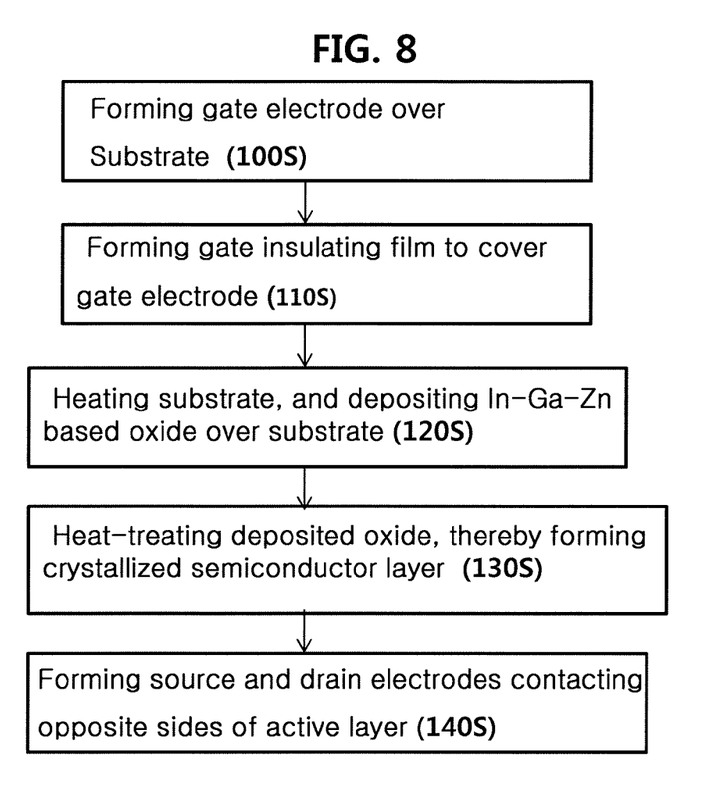
FIG. 8 is a flowchart illustrating a method for manufacturing a semiconductor device according to an embodiment of the invention.

FIG. 8 is a flowchart illustrating a method for manufacturing a semiconductor device according to an embodiment of the invention. FIGS. 9A to 9D are sectional views illustrating processes of a semiconductor device manufacturing method according to a first embodiment of the invention.

Figure 9A:
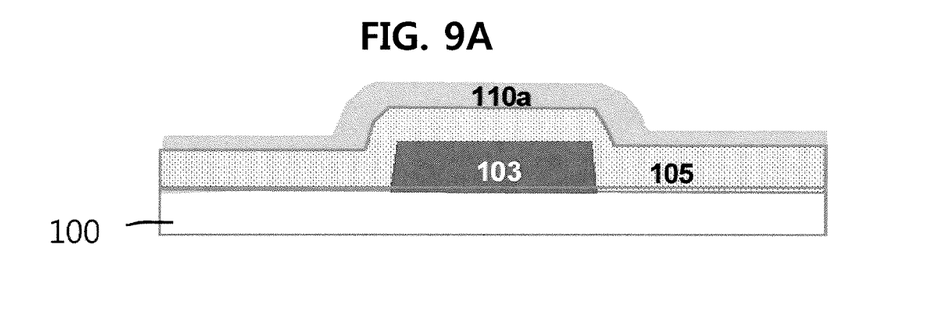
FIGS. 9A to 9D are sectional views illustrating processes of a semiconductor device manufacturing method according to a first embodiment of the invention.

First, as illustrated in FIGS. 8 and 9A, a gate electrode 103 is formed in a predetermined region on a substrate 100 (100S).

Thereafter, a gate insulating film 105 is formed over the substrate 100, to cover the gate electrode 103 (110S).

Subsequently, as illustrated in FIG. 2A, the substrate 100 is heated to a temperature of 200 to 300° C. and, as such, an In—Ga—Zn oxide is deposited over the gate insulating film 105, as illustrated in FIG. 9A (120S). In this case, the atomic % ratio of In, Ga, and Zn is 1:1:1.10 to 1.25. The reason for such an In—Ga—Zn atomic % ratio is the same as described above.

Thereafter, as illustrated in FIG. 2B, the deposited In—Ga—Zn oxide is subjected to first heat treatment, to form an oxide semiconductor layer 110a crystallized throughout the entire thickness thereof (130S).

In this case, crystallization of the oxide semiconductor layer 110a is carried out, using the crystallization method described with reference to FIGS. 1 to 2B. During heating of the substrate 100 and the first heat treatment, an excess of Zn compared to In and Ga is lost. As a result, after the process of FIG. 9A, Zn in the crystallized oxide semiconductor layer remains in the same atomic % ratio equal to those of In and Ga. That is, a stable $InGaZnO_4$ structure having uniform crystallinity is obtained through the above-described crystallization process.

Figure 9B:
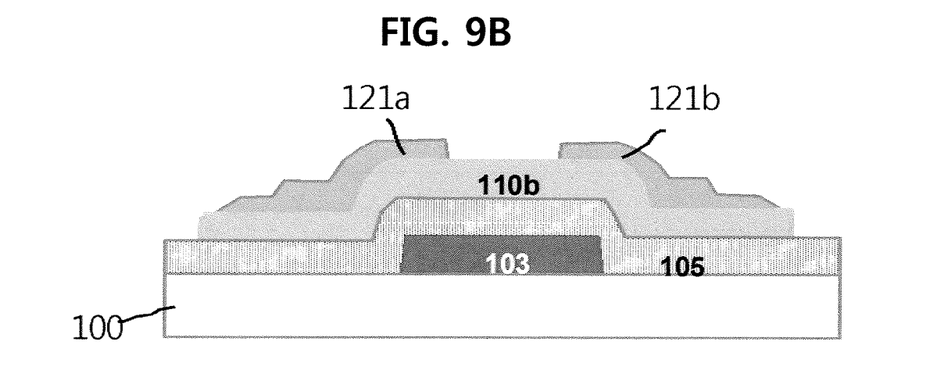

Subsequently, as illustrated in FIG. 9B, a metal layer is deposited to cover the oxide semiconductor layer 110a. The metal layer is then etched together with the oxide semiconductor layer 110a, to form an active layer 110b overlapping with the gate electrode 103.

In this case, etching may be achieved by coating a photoresist (not shown) over the metal layer, and patterning the photoresist through light exposure and development, to form a photoresist pattern, and performing etching, using the photoresist pattern. The photoresist pattern may have a shape including a portion disposed over the gate electrode 103 while having a first thickness, and portions disposed over regions where source and drain electrodes 121a and 121b will be formed, while having a second thickness greater than the first thickness. Using the photoresist pattern, accordingly, the metal layer and oxide semiconductor layer 110a are etched in a primarily exposed region, to form the crystallized oxide semiconductor layer into an active layer 110b having a predetermined width. Subsequently, the photoresist pattern is ashed until the first thickness thereof is almost removed, to expose a portion of the metal layer disposed over the gate electrode 103. The metal layer portion is then etched, to complete formation of the source and drain electrodes 121a and 121b. A portion of the active layer 110b disposed between the source electrode 121a and the drain electrode 121b is over-etched at a surface thereof during the process of etching the metal layer.

Meanwhile, when the above-described semiconductor device is applied to a display device, a pixel electrode to be connected to the semiconductor device is provided for each pixel.

Figure 9C:
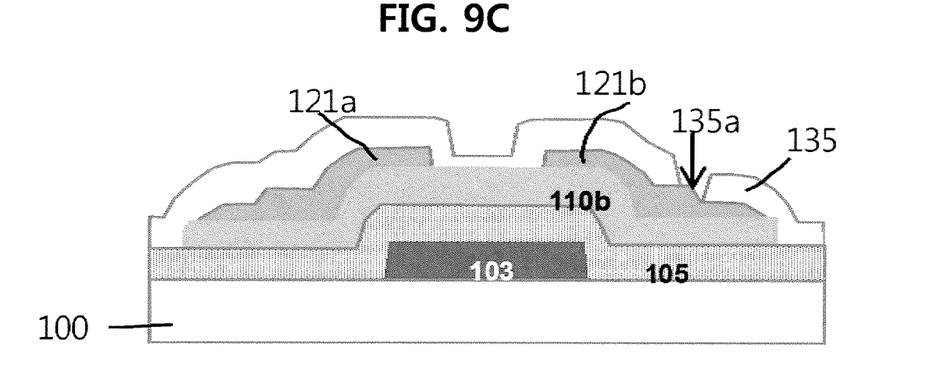
Figure 9D:
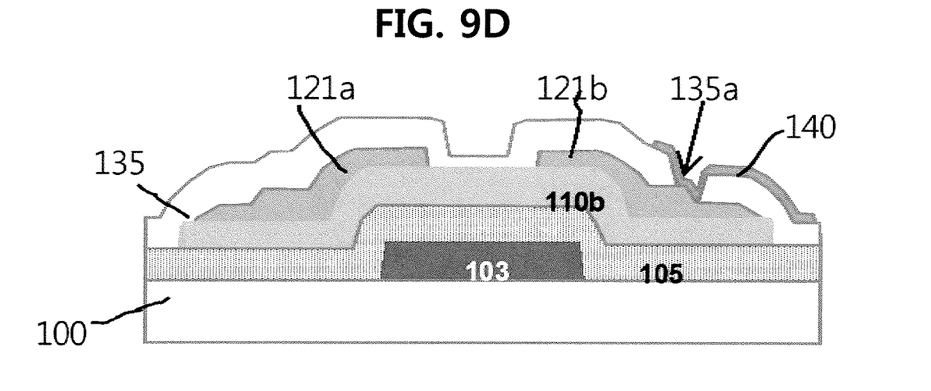

FIGS. 9C and 9D illustrate a pixel electrode formation method to be carried out after the process of FIG. 9B.

As illustrated in FIG. 9C, a passivation film 135 is formed over the gate insulating film 105 including the source electrode 121a and drain electrode 121b. The passivation film 135 is then selectively removed, to form a contact hole 135a, through which a portion of the drain electrode 121b is exposed.

As illustrated in FIG. 9D, a pixel electrode 140 is then formed, to be connected to the drain electrode 121b via the contact hole 135a.

Second Embodiment

Figure 10A:
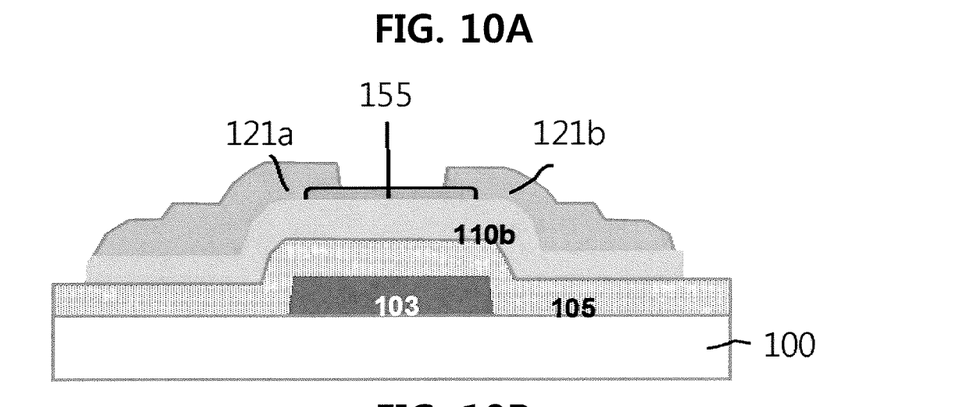
FIGS. 10A to 10C are sectional views illustrating processes of a semiconductor device manufacturing method according to a second embodiment of the invention.

After formation of a crystallized oxide semiconductor layer 110a, as described in the first embodiment, an etch stopper 155 is formed on the crystallized oxide semiconductor layer 110a, to almost overlap with a gate electrode 103, as illustrated in FIG. 10A.

Thereafter, a metal layer is deposited over the crystallized oxide semiconductor layer 110a including the etch stopper 155. The metal layer is then selectively removed such that a portion of the metal layer corresponding to a portion of the gate electrode 103 and remaining portions of the metal layer, except for portions of the metal layer disposed around the gate electrode 103, are removed, to form a source electrode 121a and a drain electrode 121b.

In this case, the oxide semiconductor layer is also removed in a region where the metal layer is removed, to form an active layer 110b. Since the etch stopper 155 is disposed in a region between the source electrode 121a and the drain electrode 121b above the gate electrode in this case, the active layer 110b remains intact without being etched.

Figure 10B:
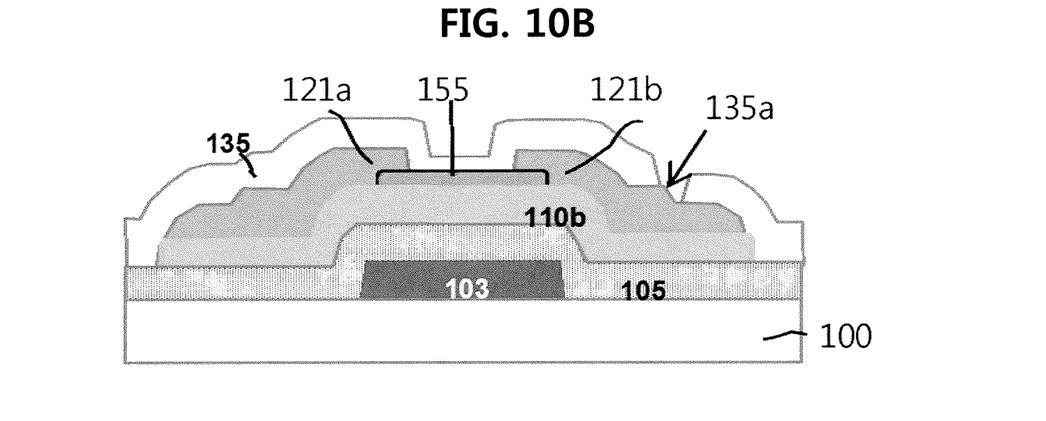
Figure 10C:
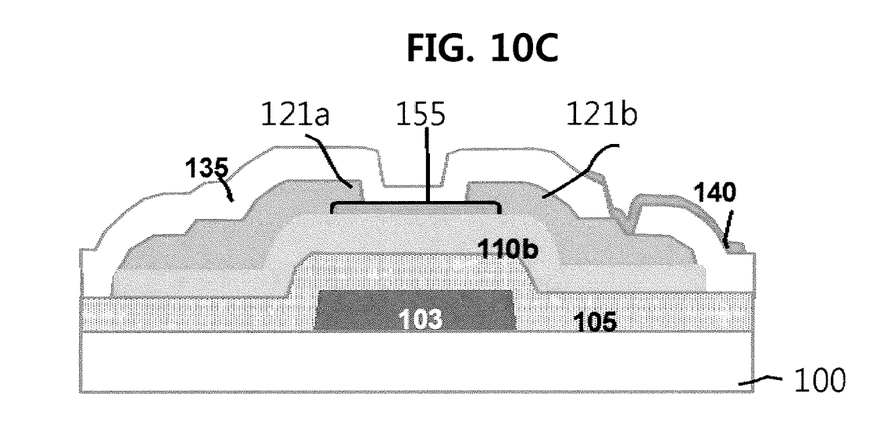

Thereafter, as illustrated in FIGS. 10B and 10C, formation of a passivation film 135 including a contact hole 135a and formation of a pixel electrode 140 to be connected to the drain electrode 121b via the contact hole 135a are carried out. Formation of the passivation film 135 and the shape of the pixel electrode 140 are the same as described in the first embodiment.

Figure 11A:
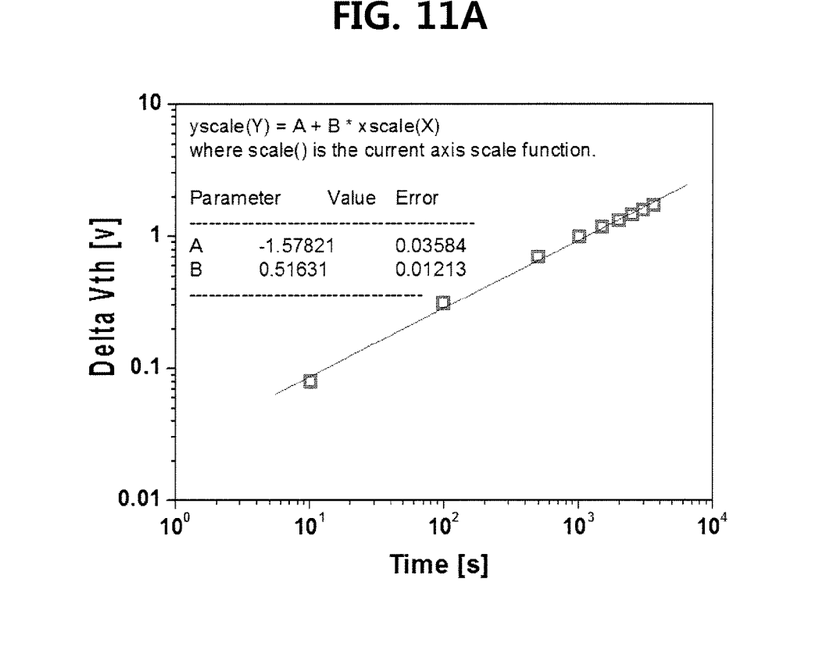
FIGS. 11A and 11B are graphs depicting threshold voltage shift delta Vth of an amorphous oxide semiconductor and a crystalline oxide semiconductor according to the passage of time according to an embodiment of the invention.
Figure 11B:
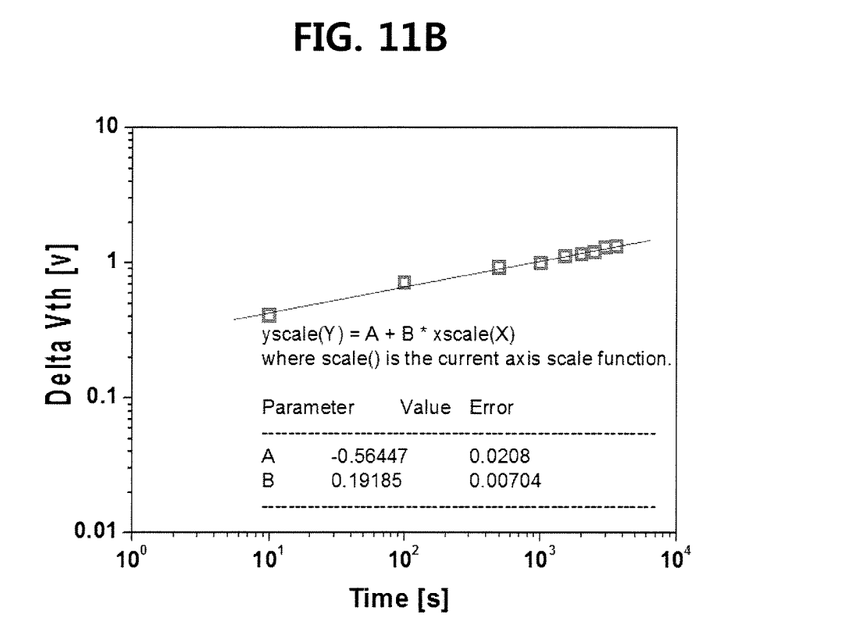

FIGS. 11A and 11B are graphs depicting delta Vth (threshold voltage shift) of an amorphous oxide semiconductor and a crystalline oxide semiconductor depending on passage of time.

In detail, FIGS. 11A and 11B illustrate delta Vth depending on passage of time in semiconductor devices respectively using an amorphous oxide semiconductor and a crystalline oxide semiconductor. In particular, FIGS. 11A and 11B illustrate positive bias temperature stress (PBTS).

When a crystalline oxide semiconductor layer of FIG. 11B is used, an increase rate of delta Vth depending on passage of time becomes gradual as if the degree of threshold voltage shift becomes saturated, as compared to the case in which an amorphous oxide semiconductor layer of FIG. 11A is used. This behavior shows that, when the crystalline oxide semiconductor layer is applied to a semiconductor device, as an active layer, there is an advantage in securing reliability of the device.

The semiconductor device manufactured in accordance with the above-described semiconductor device manufacturing method may be described with reference to FIGS. 9B and 10A.

For example, as illustrated in FIG. 9B, the semiconductor device includes the gate electrode 103 disposed in a predetermined region on the substrate 100, the gate insulating film 105 formed over the substrate 100, to cover the gate electrode 103, the patterned active layer 110b formed on the gate insulating film 105 while having the lattice structure of FIG. 6A in accordance with deposition and crystallization using the method of FIGS. 1 to 2B, and the source electrode 121a and drain electrode 121b respectively contacting opposite sides of the active layer 110b.

When the above-described semiconductor device is applied to a display device, the semiconductor device is arranged at each pixel. In this case, gate lines and data lines, which intersect with each other, are provided to distinguish pixels from one another. The gate electrode of the semiconductor device is formed integrally with a corresponding one of the gate lines. The source electrode of the semiconductor device is formed to protrude from a corresponding one of the data lines. Thus, each pixel may be driven in accordance with selective signal application from the corresponding gate line and data line.

Of course, as illustrated in FIG. 10A associated with the second embodiment, the etch stopper 155 may be further formed before formation of the source and drain electrodes 121a and 121b in order to protect a channel of the active layer 110b.

In crystallization of the active layer 110b of the invention, the composition ratio of In, Ga, and Zn is determined such that the content of Zn is greater than those of the remaining ingredients, in order to compensate for loss of Zn possibly made during deposition and crystallization processes and, as such, the ingredients of the oxide semiconductor layer remaining in the final active layer 110b are ingredients of $InGaZnO_4$ in which the atomic % ratio of In, Ga, and Zn is almost equal to 1:1:1. In this case, although the content of remaining Zn may vary in accordance with deposition time, crystallization time, oxygen partial pressure, working pressure, or the like, Zn remains 0.9 to 1.1 times the content of In.

Thus, in the active layer 110b subjected to crystallization, loss of Zn possibly made during deposition and heat treatment processes is compensated for by sufficient supply of Zn and, as such, it may be possible to sufficiently crystallize the active layer 110b even when a low-temperature process is used. Accordingly, when the above-described active layer is used as the active layer of a semiconductor device, enhanced electron mobility is obtained by virtue of a reduction in internal defect density, as compared to an amorphous oxide semiconductor structure. In addition, the degree of threshold voltage shift exhibits a tendency toward saturation with passage of time. Accordingly, reliability of the device can be remarkably enhanced.

As apparent from the above description, the oxide semiconductor layer crystallization method according to the embodiments of the invention, the semiconductor device manufactured using the same, and the method for manufacturing the semiconductor device have the following effects.

In an In—Ga—Zn oxide, which is a target of transparent semiconductor, the atomic % ratio of Zn (zinc) is greater than those of In (indium) and Ga (Galium) and, as such, a sufficient amount of Zn is supplied to compensate for loss of Zn possibly made in crystallization using a low-temperature process. Accordingly, a stably crystallized oxide semiconductor layer may be obtained. On the contrary, the known crystallization methods of the related art use a target having the same composition ratio as the oxide semiconductor layer and, as such, insufficient crystallization is generated if a temperature is applied at a low temperature. For this reason, it may be impossible to obtain expected crystallization effects with the known crystallization methods.

Thus, crystallization at a low temperature of 350° C. or less is possible in the present invention. Accordingly, when a semiconductor device is manufactured, using the oxide semiconductor layer formed through the hereinafter described crystallization method, the semiconductor device may stably operate in association with bias stress, as compared to a structure using an amorphous oxide semiconductor layer. In this regard, reliability of the device may be secured. And there is no limitation to select a substrate since crystallization may be carried out at a low temperature. So it is possible to use a flexible substrate, thus it makes to give flexibility and slimness into a device.

In addition, in the crystallization method according to the embodiments of the invention, the substrate is heated, starting from a deposition process, and, at the same time, deposition is simultaneously carried out. On the contrary, in known methods, however, heat treatment for crystallization is carried out after deposition. In the crystallization method of the invention, accordingly, it may be possible to set crystallinity in a thickness direction of the oxide semiconductor layer at an early stage of deposition and, as such, stable arrangement of crystal particles may be obtained throughout the entire thickness of the oxide semiconductor layer or an active layer.

It will be apparent to those skilled in the art that various modifications and variations can be made in the invention without departing from the spirit or scope of the inventions. Thus, it is intended that the invention covers the modifications and variations of this invention provided they come within the scope of the appended claims and their equivalents.

What is claimed is:

1. A method for manufacturing a semiconductor device, the method comprising:
    a first step of forming a gate electrode on a substrate;
    a second step of forming a gate insulating film over the substrate, to cover the gate electrode;
    a third step of depositing an In—Ga—Zn oxide over the gate insulating film while heating the substrate to a temperature of 200 to 300° C., wherein an atomic percent ratio of Zn in the In—Ga—Zn oxide as-deposited is higher than each atomic percent ratio of In and Ga;
    a fourth step of heat-treating the deposited In—Ga—Zn oxide at a temperature of 200 to 350° C., thereby forming an active layer crystallized throughout an entire thickness of the active layer; and
    a fifth step of forming a source electrode and a drain electrode, which contact opposite sides of the active layer, respectively.

2. The method according to claim 1, further comprising:
    a sixth step of forming an etch stopper at a position overlapping with the gate electrode between the fourth step and the fifth step.

3. The method according to claim 2, wherein an atomic % ratio of In, Ga, and Zn during the third step is 1:1:1.10~1.25.

4. The method according to claim 3, wherein an excess of Zn compared to amounts of In and Ga is lost during the third and the fourth steps, so that Zn remaining in the active layer formed after the fourth step has an atomic percent ratio corresponding to each atomic percent ratio of In and Ga.

* * * * *